(12) United States Patent
Miyamoto et al.

(10) Patent No.: US 7,929,036 B2
(45) Date of Patent: Apr. 19, 2011

(54) SOLID-STATE IMAGING DEVICE HAVING IMPROVED LIGHT SENSITIVITY AND A METHOD FOR PRODUCING THE SAME

(75) Inventors: Hiroyuki Miyamoto, Kanagawa (JP); Tadayuki Dofuku, Kumamoto (JP)

(73) Assignee: Sony Corporation, Tokyo (JP)

( * ) Notice: Subject to any disclaimer, the term of this patent is extended or adjusted under 35 U.S.C. 154(b) by 1499 days.

(21) Appl. No.: 11/331,252

(22) Filed: Jan. 12, 2006

(65) Prior Publication Data

US 2006/0166389 A1 Jul. 27, 2006

(30) Foreign Application Priority Data

Jan. 27, 2005 (JP) ................ P2005-109796

(51) Int. Cl.
*H04N 5/335* (2011.01)
(52) U.S. Cl. ......... 348/311; 348/308; 438/595; 438/639
(58) Field of Classification Search .......... 348/294–324; 438/595, 639
See application file for complete search history.

(56) References Cited

U.S. PATENT DOCUMENTS

| | | | | |
|---|---|---|---|---|
| 4,819,074 A * | 4/1989 | Suzuki | ........................... | 348/298 |
| 7,411,620 B2 * | 8/2008 | Taniguchi et al. | ............. | 348/294 |
| 2002/0060742 A1 * | 5/2002 | Takubo | ........................ | 348/241 |
| 2002/0105585 A1 * | 8/2002 | Kimura | ........................ | 348/308 |
| 2004/0147068 A1 * | 7/2004 | Toyoda et al. | ............... | 438/197 |
| 2004/0232494 A1 * | 11/2004 | Nagano et al. | ............... | 257/382 |
| 2005/0088556 A1 * | 4/2005 | Han | ............................. | 348/308 |
| 2005/0153469 A1 * | 7/2005 | Ochi | ............................. | 438/22 |
| 2006/0011952 A1 * | 1/2006 | Ohkawa | ........................ | 257/291 |
| 2006/0061674 A1 * | 3/2006 | Iida et al. | ..................... | 348/308 |
| 2006/0166389 A1 * | 7/2006 | Miyamoto et al. | ............. | 438/22 |

* cited by examiner

*Primary Examiner* — John M Villecco
*Assistant Examiner* — Kent Wang
(74) *Attorney, Agent, or Firm* — SNR Denton US LLP

(57) ABSTRACT

To provide a method for producing a solid-state imaging device enabling an improvement of a light sensitivity characteristic in a light receiving unit, a solid-state imaging device in which the light sensitivity characteristic is improved, and a camera provided with the solid-state imaging device. A shield film projected around the light receiving unit is formed on a substrate in which the light receiving unit is formed; an transparent insulation film is formed on the shield film; a sidewall insulation film is formed by etch-back of the insulation film, in a side wall of the shield film; a mask layer having an aperture at a position corresponding to the light receiving unit is formed on the shield film; and the shield film is etched by using the sidewall insulation film and the mask layer as a mask to form an aperture portion exposing the light receiving unit.

19 Claims, 19 Drawing Sheets

SOLID-STATE IMAGING DEVICE HAVING IMPROVED LIGHT SENSITIVITY AND A METHOD FOR PRODUCING THE SAME

CROSS REFERENCES TO RELATED APPLICATIONS

The present invention contains subject matter related to Japanese Patent Application No. JP 2005-19796 filed in the Japanese Patent Office on Jan. 27, 2005, the entire contents of which being incorporated herein by reference.

BACKGROUND OF THE INVENTION

1. Field of the Invention

The present invention relates to a method for producing a solid-state imaging device, a solid-state imaging device, and a camera, for example, a method for producing a solid-state imaging device such as a charge coupled device (CCD), the solid-state imaging device, and a camera provided with the solid-state imaging device.

2. Description of the Related Art

A method for producing a solid-state imaging device in related art will be described with reference to FIGS. 1A and 1B, FIGS. 2A and 2B, and FIGS. 3A and 3B.

As shown in FIG. 1A, an n-type signal charge storage region 113, an n-type transfer channel region 115, and a channel stop region 118 are formed in a p-type well 112 of an n-type silicon substrate (substrate) 111. The p-type well 112 between the signal charge storage region 113 and the transfer channel region 115 functions as a read out gate region 117. A gate insulation film 120 is formed on the substrate 111, a transfer electrode 121 is formed on the gate insulation film 120, and an insulation film 122 is formed to cover the transfer electrode 121. The transfer electrode 121 and the insulation film 122 are used as a mask and applied with ion implantation method to thereby form a p-type hole storage region 114. A light receiving unit 105 has the signal charge storage region 113 and the hole storage region 114. And a vertical transfer unit 107 has the transfer channel region 115 and the transfer electrode 121. A read out gate unit 106 has the read out gate region 117 and the transfer electrode 121.

As shown in FIG. 1B, a shield film 123 is formed to cover the transfer electrode 121. As the shield film 123, a high shieldability metal film such as aluminum or tungsten is formed by spattering method or chemical vapor deposition (CVD) method.

As shown in FIG. 2A, a resist film 126 with a mask aperture C at a region of the light receiving unit 105 is formed by coating a resist film on the shield film 123, exposing and developing the same.

As shown in FIG. 2B, the resist film 126 is used as a mask and a portion of the shield film 123 exposed from the mask aperture C is removed to form an aperture portion 123a in the shield film 123. As shown in FIG. 3A, the resist film 126 is removed.

As shown in FIG. 3B, a protective insulation film 125 is formed on the substrate 111 to cover the shield film 123. The protective film 125 is made from silicon oxide film or silicon nitride film, for example.

As the following steps, if necessary, a color filter and an on-chip lens are formed to thereby produce the solid-state imaging device.

Japanese Unexamined Patent Publication No. 7-202160 and No. 8-32045 disclose such aperture portion 123a for exposing a region to be the light receiving unit 105 by applying a patterning process used with the resist film 126, for example.

SUMMARY OF THE INVENTION

However, in the above method for producing the solid-state imaging device in related art, the following disadvantages occur.

FIGS. 4A and 4B are views for explaining a disadvantage in the method for producing the solid-state imaging device in related art, in which FIG. 4A is a plan view of the shield film and FIG. 4B is a cross-sectional view thereof. FIGS. 5A and 5B are views for explaining the other disadvantage in the method for producing the solid-state imaging device in related art, in which FIG. 5A is a plan view of the shield film and FIG. 5B is a cross-sectional view thereof.

In the solid-state imaging device, an area of the aperture portion 123a formed in the shield film 123 is formed as large as possible in terms of an improvement of a light sensitivity characteristic. However, the shield film 123 is formed with a high step difference caused by the transfer electrode 121, so a corner rounding is generated in the aperture portion 123a (referring to a D portion in FIG. 4A) and the extending portion of the shield film 123 is generated on a light receiving unit 105 region when patterning the shield film 123 by using the resist film 126, which cause a reduction of an aperture area and a deterioration of the light sensitivity characteristic.

When a method for enlarging an area of the mask aperture C of the resist film 126 or for over-etching the shield film 123, is applied in order to enlarge the area of the aperture portion 123a, a side wall of the shield film 123 is partially lacked and the side wall thereof becomes asymmetric (referred to an F portion in FIGS. 5A and 5B). The lacked side wall causes a deterioration of smear and the asymmetric side wall causes variation in the light sensitivity.

The above disadvantages occur in the same way when a hard mask made of inorganic material is used instead of the resist film 126. This is because a pattern of the hard mask is also formed by etching with a resist film and a dimension of the aperture portion 123a depends on a variation in a line width and of a superposition in a lithography process.

It is desirable to provide a method for producing a solid-state imaging device enabling an improvement of a light sensitivity characteristic.

It is also desirable to provide a solid-state imaging device in which the light sensitivity characteristic is improved and a camera provided with the solid-state imaging device.

According to an embodiment of the present invention, there is provided a method for producing a solid-state imaging device having the steps of: forming a light receiving unit in an imaging region of a substrate; forming a shield film projected out around the light receiving unit, on the substrate; forming an optically transparent insulation film on the shield film; processing the insulation film by etch-back to form a sidewall insulation film in a side wall of the shield film formed in a periphery portion of the light receiving unit; forming a mask layer having a mask aperture at a position corresponding to the light receiving unit, on the shield film; and etching the shield film by using the sidewall insulation film and the mask layer as an etching mask to form an aperture portion exposing the light receiving unit.

In the method for producing the solid-state imaging device according to the embodiment of the present invention, the insulation film is processed by etch-back to form a transparent sidewall insulation film in a side wall of the shield film which is formed and projected around the light receiving unit. The sidewall insulation film is formed in self-alignment.

The sidewall insulation film and the mask layer are used as the etching mask and the shield film is etched to form the aperture portion exposing the light receiving unit.

A dimension of the aperture portion is mainly determined by the sidewall insulation film formed in self-alignment. The mask layer functions as an etching protective layer for protecting a surface of the shield film.

According to an embodiment of the present invention, there is provided a solid-state imaging device having: a light receiving unit formed in a substrate; a shield film formed on the substrate and having an aperture portion at a position corresponding to the light receiving unit; and an optically transparent sidewall insulation film formed in an upper portion of a side wall of the shield film along an edge of the aperture portion, the shield film under the sidewall insulation film being removed.

The solid-state imaging device according to the embodiment of the present invention is formed with the sidewall insulation film in an upper portion of the side wall of the shield film along an edge of the aperture portion of the shield film. The sidewall insulation film is used when forming the aperture portion of the shield film.

The sidewall insulation film is an optically transparent film, and the shield film dose not present under the sidewall insulation film. So the light emitted to the sidewall insulation film passes through the sidewall insulation film, is emitted to the light receiving unit, and is converted to electrical signals by the light receiving unit.

According to an embodiment of the present invention, there is provided a camera having: a solid-state imaging device; an optical system focusing light on a imaging surface of the solid-state imaging device; and a signal processing circuit performing a predetermined signal processing to a signal output from the solid-state imaging device, wherein the solid-state imaging device has a light receiving unit formed in a substrate, a shield film formed on the substrate and having an aperture portion at a position corresponding to the light receiving unit, and an optically transparent sidewall insulation film formed in an upper portion of a side wall of the shield film along an edge of the aperture portion, the shield film under the sidewall insulation film being removed.

In the camera according to the embodiment of the present invention, the solid-state imaging device is formed with the sidewall insulation film in an upper portion of the side wall of the shield film along an edge of the aperture portion of the shield film. The sidewall insulation film is used when forming the aperture portion of the shield film.

The sidewall insulation film is an optically transparent film, and the shield film dose not present under the sidewall insulation film. So the light emitted to the sidewall insulation film passes through the sidewall insulation film, is emitted to the light receiving unit, and is converted to electrical signals by the light receiving unit.

According to the method for producing the solid-state imaging device of the embodiment of the present invention, it is able to produce the solid-state imaging device in which the light sensitivity characteristic is improved.

According to the embodiment of the present invention, it is able to realize the solid-state imaging device and the camera in which the light sensitivity characteristic is improved.

BRIEF DESCRIPTION OF THE DRAWINGS

The above and other features of embodiments of the present invention will be apparent in more detail with reference to the accompanying drawings, in which:

FIGS. 4A and 4B are views of explaining a disadvantage in the method for producing the solid-state imaging device in related art, wherein FIG. 4A is a plan view of a shield film and FIG. 4B is a cross-sectional view of the shield film;

FIGS. 5A and 5B are views of explaining a disadvantage in the method for producing the solid-state imaging device in related art, wherein FIG. 5A is a plan view of a shield film and FIG. 5B is a cross-sectional view of the shield film;

DESCRIPTION OF THE PREFERRED EMBODIMENTS

Preferred embodiments of the present invention will be described in more detail with reference to the accompanying drawings. In the present embodiment, an example applying the present invention to an interline transfer type solid-state imaging device will be described.

Figure 1A:
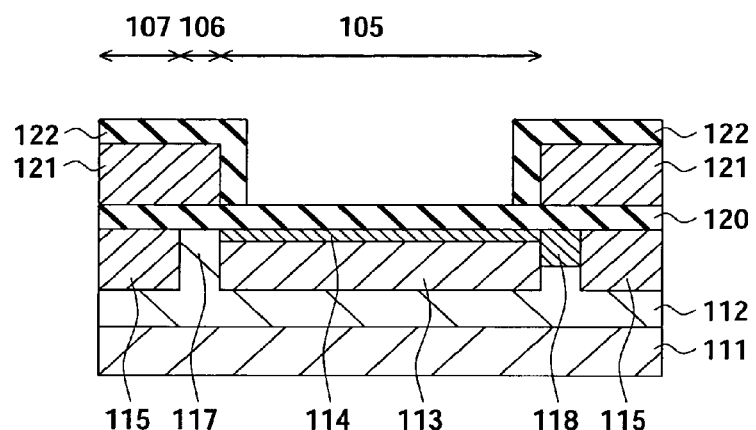
FIGS. 1A and 1B are cross-sectional views of a process in a method for producing a solid-state imaging device in related art.
Figure 1B:
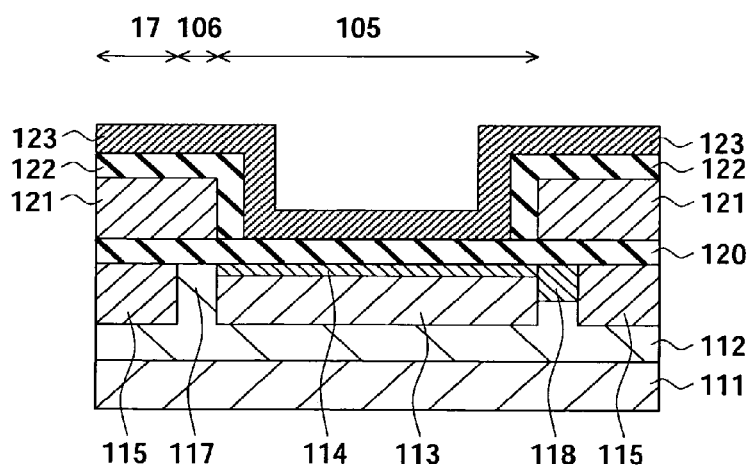
Figure 2A:
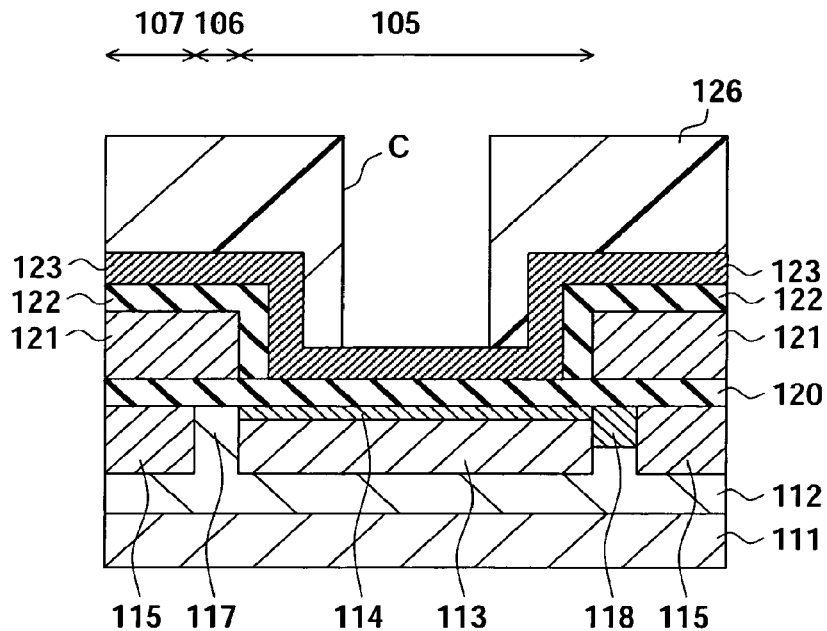
FIGS. 2A and 2B are cross-sectional views of the process in the method for producing the solid-state imaging device in related art.
Figure 2B:
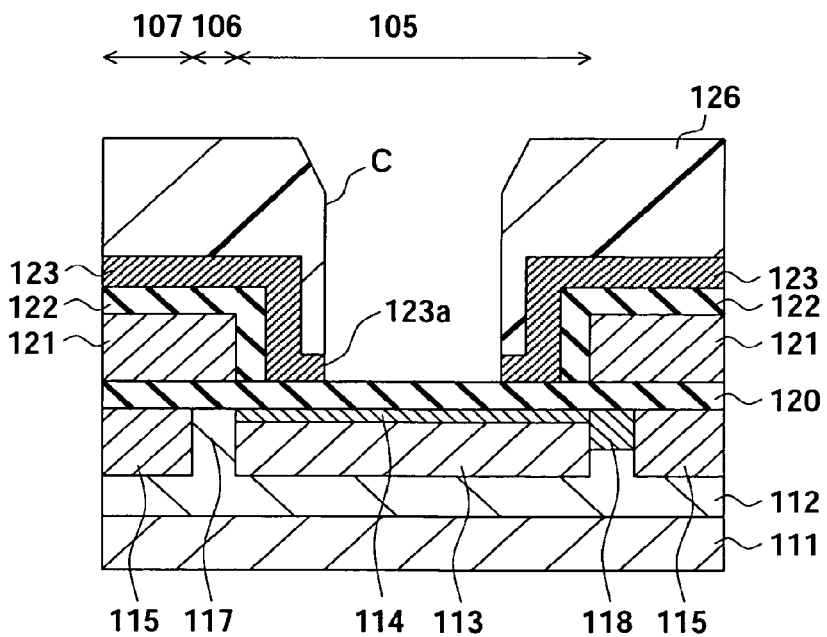
Figure 3A:
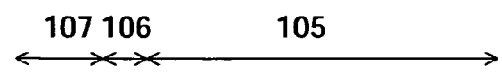
FIGS. 3A and 3B are cross-sectional views of a process in the method for producing the solid-state imaging device in related art.
Figure 3A:
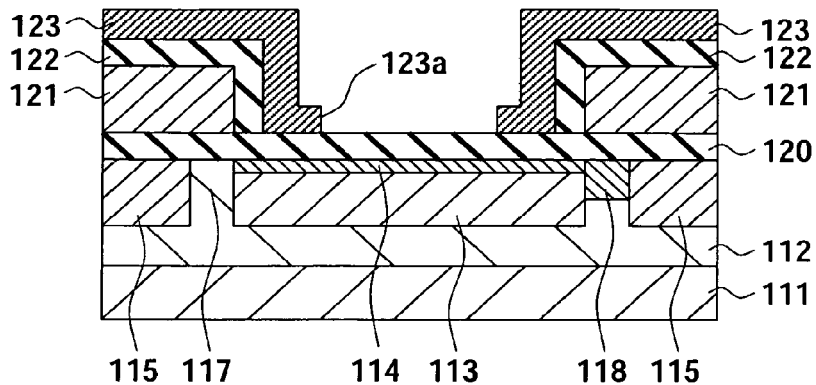
Figure 3B:
Figure 3B:
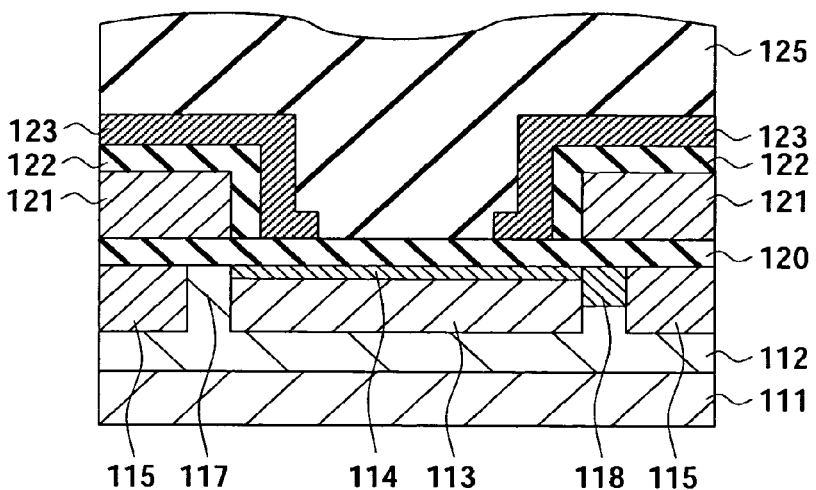
Figure 4A:
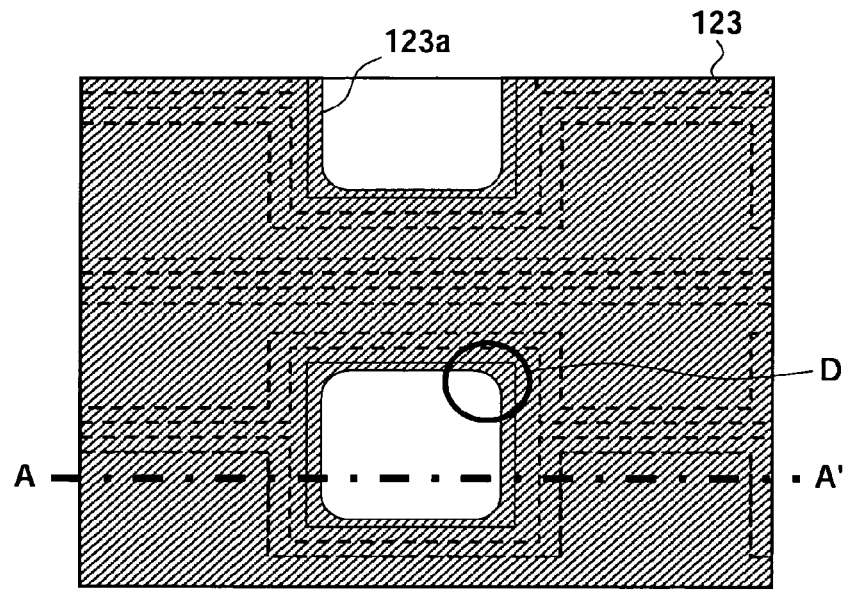
Figure 4B:
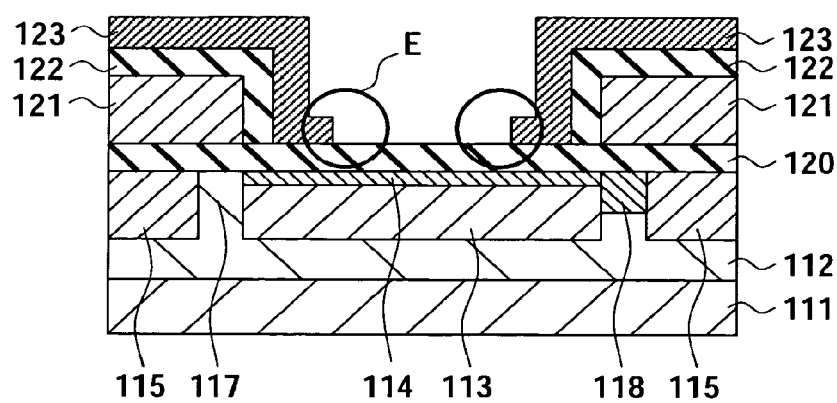
Figure 5A:
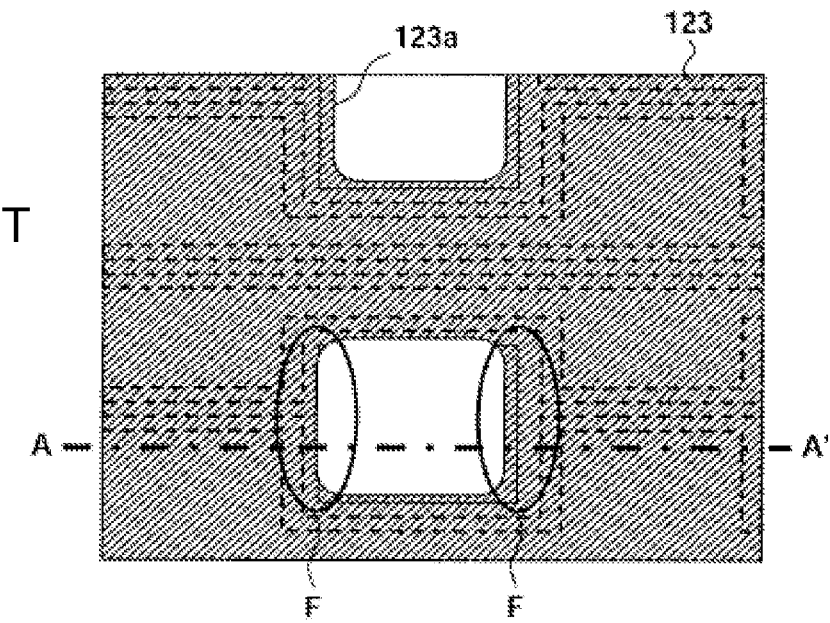
Figure 5B:
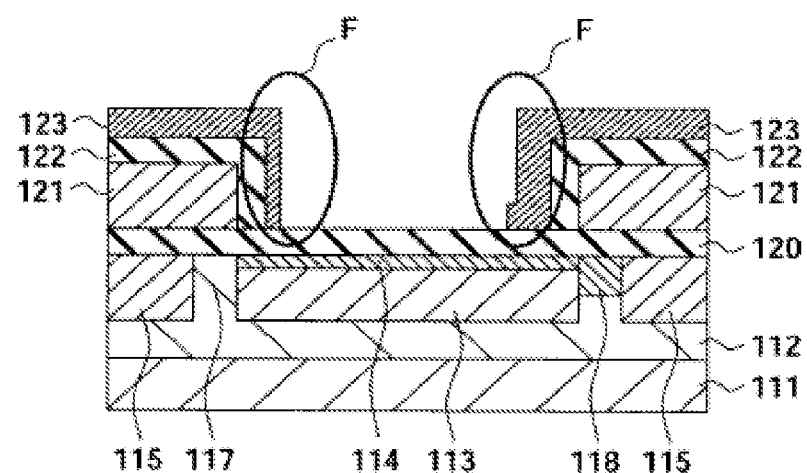
Figure 6:
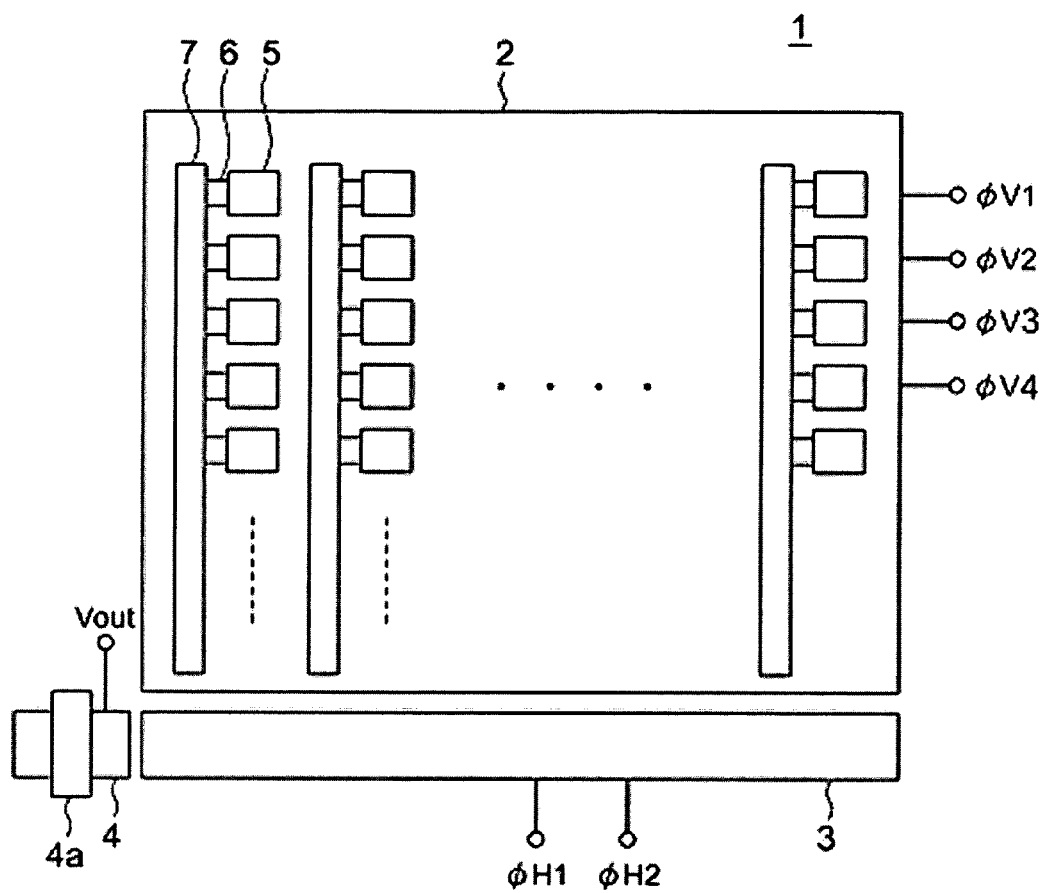
FIG. 6 is a configuration view of an example of a solid-state imaging device according to the present embodiment.

FIG. 6 is a schematic configuration view of a solid-state imaging device according the present embodiment.

A solid-state imaging device 1 according to the present embodiment is provided with an imaging region 2, a horizontal transfer unit 3 and an output unit 4.

The imaging region 2 has a plurality of light receiving units 5 arranged in matrix, a plurality of vertical transfer units 7 arranged in every row of the light receiving units 5, and read out gate units 6 placed between the light receiving unit 5 and the vertical transfer unit 7.

The light receiving unit 5 is formed by a photo diode, for example, converts an imaging light (incidence light) emitted from an object to be imaged to signal charges having the amount of charges corresponding to the amount of the light, and stores the resultant. The read out gate unit 6 reads out the signal charges stored in the light receiving unit 5 to the vertical transfer unit 7. The vertical transfer unit 7 is driven by four phases of clock signals φV1, φV2, φV3, and φV4, and transfers the signal charges read out from the light receiving unit 5 in a vertical direction (a downward direction in the drawing). Note that, the clock signal is not limited to the four phases.

The horizontal transfer unit 3 is driven by two phases of clock signals φH1 and φH2, and transfers the signal charges transferred in the vertical direction from the vertical transfer unit 7, in a horizontal direction (left direction in the drawing).

The vertical transfer unit 7 and the horizontal transfer unit 3 have a transfer channel region formed in a substrate and extending in a transferring direction and a plurality of transfer electrodes formed and arranged in the transferring direction while sandwiching an insulation film on the transfer channel region.

When applying a voltage to the transfer electrode, a potential-well is formed in the transfer channel region. Since the clock signal for forming the potential-well is shifted with its phase and applied to the respective transfer electrodes arranged in the transferring direction, a distribution of the potential-well is successively changed, so the charges in the potential-well are transferred along the transferring direction.

The output unit 4 has a charge-voltage conversion unit 4a, for example, formed by a floating diffusion, converts the signal charges transferred from the horizontal transfer unit 3 in the horizontal direction to the electric signals, and outputs the resultant as an analog image signals.

Figure 7A:
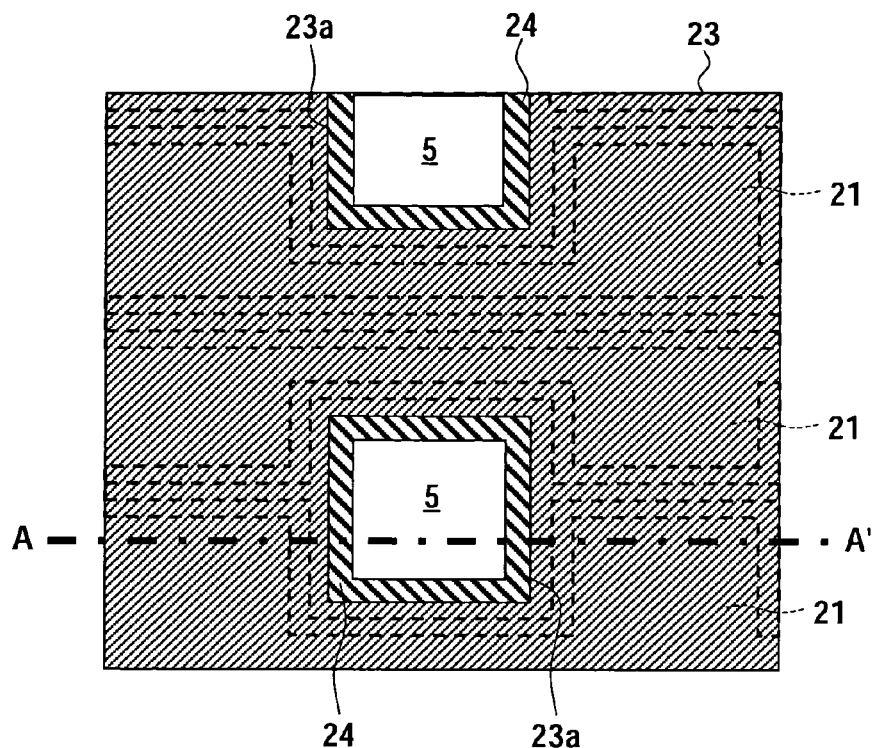
FIG. 7A is a plan view of a main portion of an imaging region and FIG. 7B is a cross-sectional view along A-A' line in FIG. 7A.
Figure 7B:
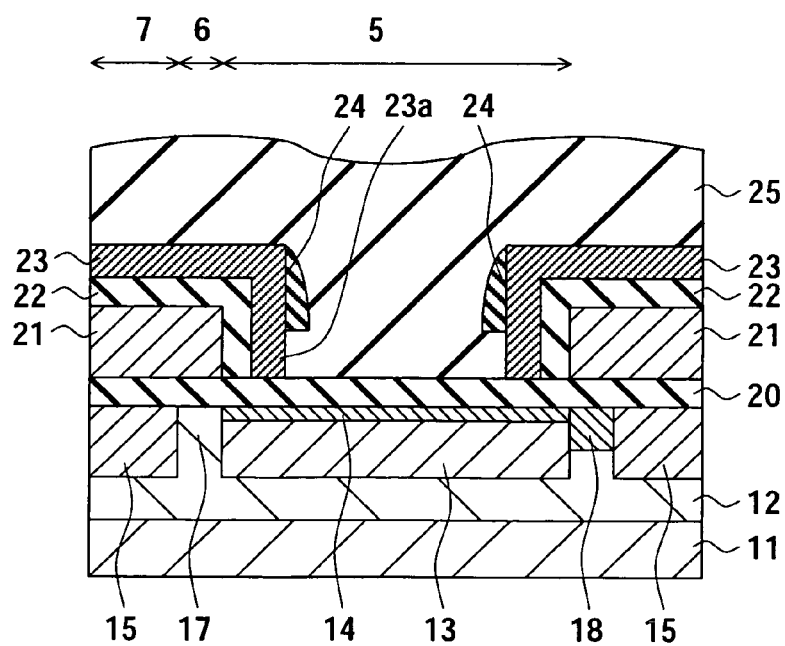
Figure 8:
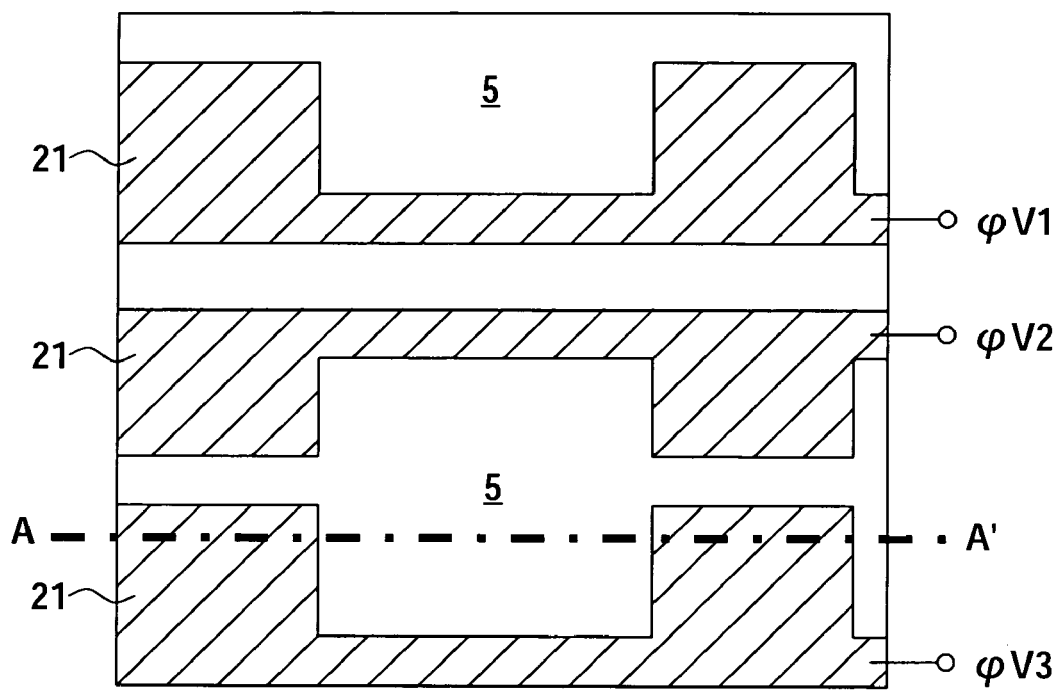
FIG. 8 is a plan view showing a layout of transfer electrodes.

FIG. 7A is a plane view of a main portion of the imaging region 2 in FIG. 6, and FIG. 7B is a cross-sectional view along A-A' line in FIG. 7A. FIG. 8 is a plane view of a main portion showing an example of a layout of the transfer electrodes.

A p-type well 12 is formed in an n-type silicon substrate (hereinafter, referred to a substrate) 11. The p-type well 12 forms an overflow barrier.

The light receiving unit 5 has an n-type signal charge storage region 13 formed in the p-type well 12 and a p$^+$-type hole storage region 14 formed in a surface portion of the signal charge storage region 13. The hole storage region 14 suppresses a dark current to be a noise source generated in the surface of the signal charge storage region 13.

The light receiving unit 5 is provided with an npn structure unit formed by the signal charge storage region 13, the p-type well 12, and the substrate 11. The npn structure unit is provided with a vertical overflow drain structure in which the excessive signal charges generated by emitting the strong intensity light to the light receiving unit 5 are drained to the substrate side 11 in breaking down the overflow barrier formed by the p-type well 12.

The vertical transfer unit 7 has the transfer channel region 15 formed in the p-type well 12 at a predetermined distance from the signal charge storage region 13, and a transfer electrode 21 made of polysilicon and formed on the transfer channel region 15 via the gate insulation film 20 made from a silicon oxide film, for example.

As shown in FIG. 8, the transfer electrodes 21 are formed by a single layer, for example. Namely, the transfer electrodes 21 are arranged in the vertical direction by applying a polysilicon layer. The transfer electrodes 21 are connected in the horizontal direction. The transfer electrodes 21 are arranged to surround the light receiving unit 5. The four phases of the clock signals φV1, φV2, φV3, and φV4 are successively applied to the transfer electrodes 21 arranged in the vertical direction. The clock signals are simultaneously applied to the transform electrodes 21 arranged in the horizontal direction. Note that, the transfer electrode 21 is not limited to a single layer structure and it may be a structure with two or more layers.

The read out gate unit 6 is formed by: the p-type wall 12 (the read out gate region 17) between the signal charge storage region 13 and the transfer channel region 15; and the transfer electrode 21 formed on the read out gate region 17 via the gate insulation film 20. In the present embodiment, the transfer electrode 21 functions as a read out electrode. The read out gate region 17 generates a potential barrier between the n-type signal charge storage region 13 and the transfer channel 15. In a read out operation, a positive read out voltage is applied to the transfer electrode 21 to reduce the potential barrier of the read out gate region 17, so the signal charges are transferred from the signal charge storage region 13 to the transfer channel region 15.

A p-type channel stop region 18 is formed at a side opposed to the read out side of the signal charge storage region 13. The channel stop region 18 generates the potential barrier to the signal charges to prevent an inflow or outflow of the signal charges.

An insulation film 22 made from a silicon oxide film is formed to cover the transfer electrodes 21. A shield film 23 is formed on the insulation film 22 to cover the transfer electrodes 21. The shield film 23 is formed with an aperture portion 23a at a position corresponding to the light receiving unit 5. The shield film 23 is made of high shieldability metal material such as tungsten or aluminum. In the present embodiment, the aperture portion 23a is formed in a rectangle shape.

An optically transparent sidewall insulation film 24 made of silicon oxide or silicon nitride is formed in an upper portion of a side wall of the shield film 23 along an edge of the aperture portion 23a. The shield film 23 under the sidewall insulation film 24 is removed. Therefore, an extending portion of the shield film 23 is not generated in the present embodiment.

A protective insulation film 25 is formed in the aperture portion 23a and on the shield film 23. The protective insulation film 25 is formed by a boron phosphorous silicate glass (BPSG) film, for example.

A color filter and an on-chip lens, not shown in the drawing, are formed on the protective insulation film 25.

Next, a method for producing the solid-state imaging device according to the present embodiment will be described with reference to FIGS. 9A and 9B to FIGS. 18A and 18B. In the respective drawings, A is a cross-sectional view of a process or a plan view of the imaging region and B is a cross-sectional view of a process or a plan view of a periphery portion. Note that, the periphery portion is defined as an outer region where the transfer electrode is not formed, of the imaging region 2. For example, the periphery portion is defined as a region in the vicinity of a scribing line to be cut and where a device is not produced.

Figure 9A:
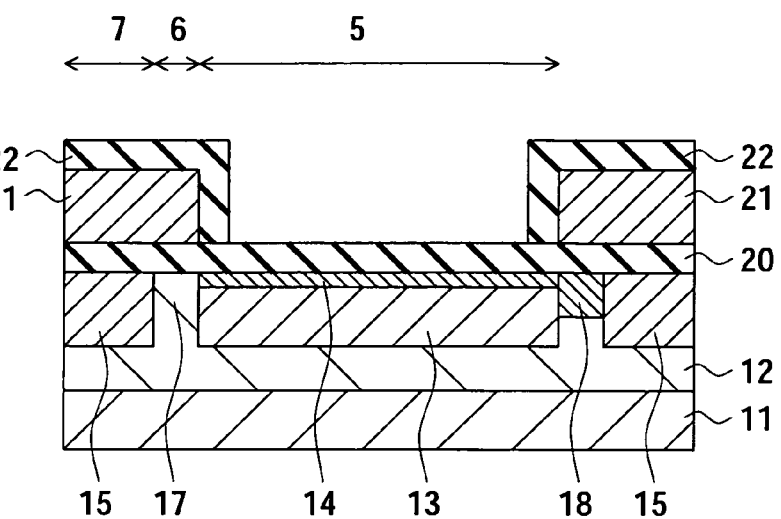
FIGS. 9A and 9B are cross-sectional views of a process in a method for producing a solid-state imaging device according to the present embodiment.
Figure 9B:
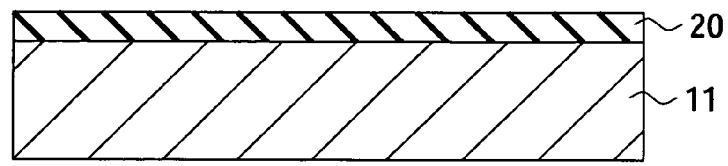

A structure unit shown in FIGS. 9A and 9B is formed. Namely, the p-type well 12, the signal charge storage region 13, the transfer channel region 15, and the channel stop region 18 are formed by ion implantation in the substrate 11 made of n-type silicon. The p-type well 12 between the signal charge storage region 13 and the transfer channel region 15 functions as the read out gate region 17. An order for forming the above regions is not limited thereto. The gate insulation film 20 is formed by thermal oxidation method in a surface of the substrate 11. The transfer electrodes 21 are formed on the substrate 11 except for a region to be the light receiving unit 5, namely on the transfer channel region 15 and the read out gate region 17. The insulation film 22 is formed by thermal oxidation method to cover the transfer electrodes 21. The hole storage region 14 is formed by ion implantation used with the transfer electrodes 21 and the insulation film 22 as a mask. At the same time, as shown in FIG. 9B, the gate insulation film 20 made of silicon oxide is formed on the substrate 11 in the periphery portion.

Figure 10A:
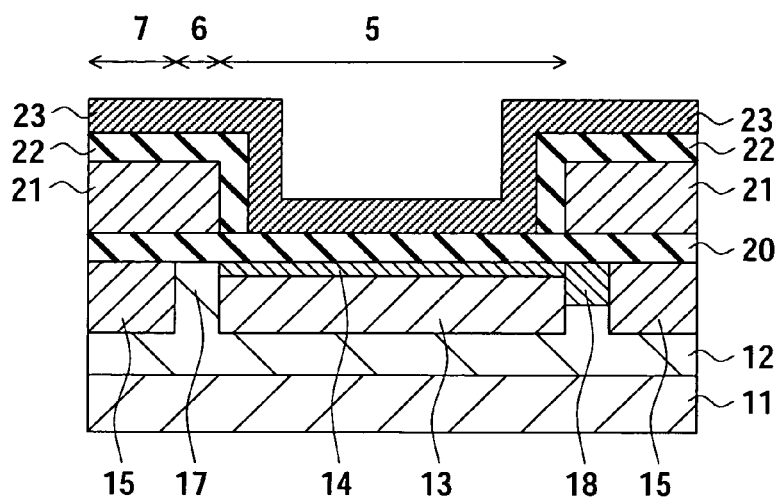
FIGS. 10A and 10B are cross-sectional views of the process in the method for producing the solid-state imaging device according to the present embodiment.
Figure 10B:
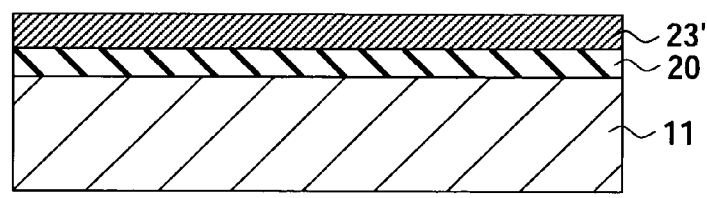

As shown in FIG. 10A, the shield film 23 is formed to cover the light receiving unit 5 and the transfer electrodes 21. The shield film 23 is, for example, a metal film with a high shieldability such as aluminum or tungsten formed by spattering method and CVD method. In the imaging region, the shield film 23 covering the transfer electrode 21 is formed with a high step difference. At the same time, as shown in FIG. 10B, a shield film material is deposited in the periphery portion where the transfer electrodes 21 are not formed, to form a monitor shield film 23'. As a result, a surface of the monitor shield film 23' is flattened in the periphery portion.

Figure 11A:
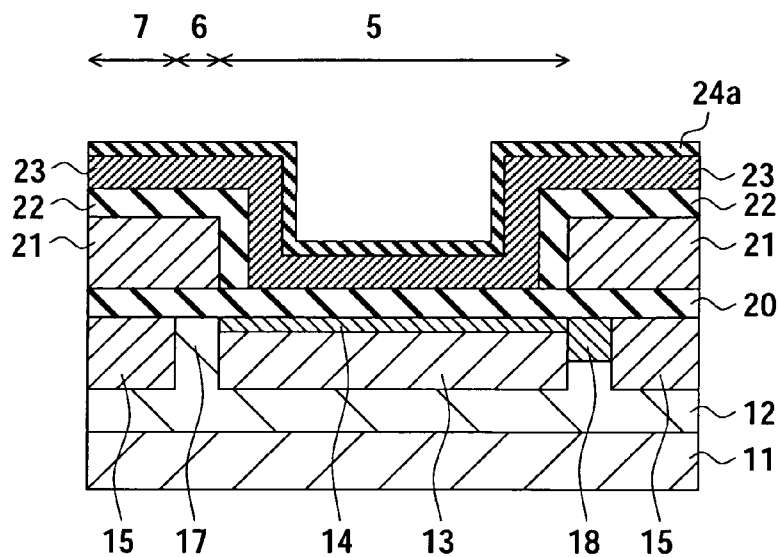
FIGS. 11A and 11B are cross-sectional views of the process in the method for producing the solid-state imaging device according to the present embodiment.
Figure 11B:
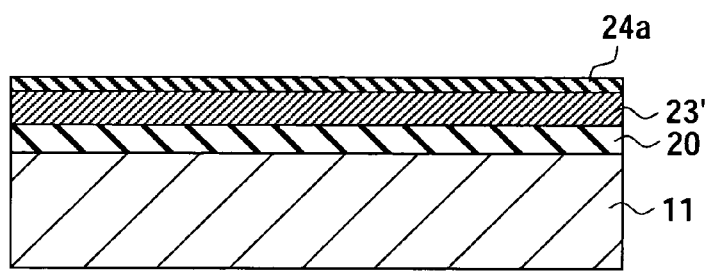

As shown in FIGS. 11A and 11B, the optically transparent insulation film 24a is formed on the shield film 23 and the monitor shield film 23'. As the insulation film 24a, a material capable of obtaining an etching selectivity to the shield film 23 is preferably used, for example, a silicon oxide film or a silicon nitride film is formed. A thickness of the insulation film 24a may be determined depending on a processing margin in the etch-back or lithography in the following processes.

Figure 12A:
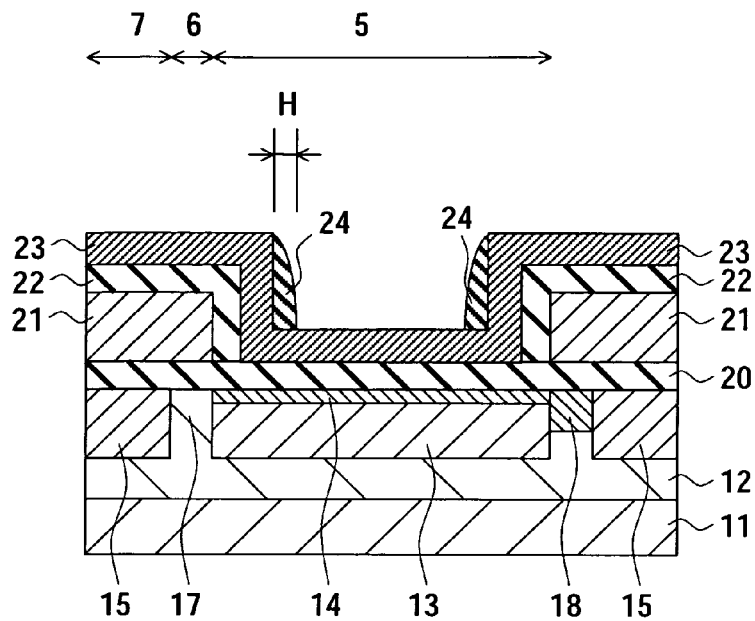
FIGS. 12A and 12B are cross-sectional views of the process in the method for producing the solid-state imaging device according to the present embodiment.
Figure 12B:
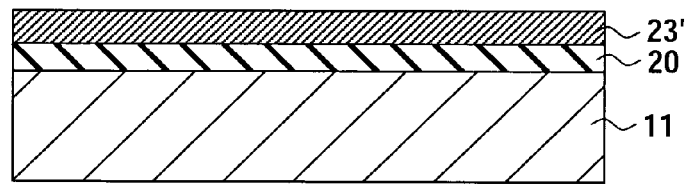

As shown in FIGS. 12A and 12B, the entire surface of the insulation film is etch-backed by applying dry etching method to thereby form the sidewall insulation film 24 in the side wall of the shield film 23. A width H of the sidewall insulation film 24 may be determined depending on a precision of the mask aperture of the resist film 26 mentioned later (precision of the lithography), for example, it is determined approximately 40 to 50 nm. Since the monitor shield film 23' is flattened in the periphery portion, the sidewall insulation film 24 is not remained.

Figure 13A:
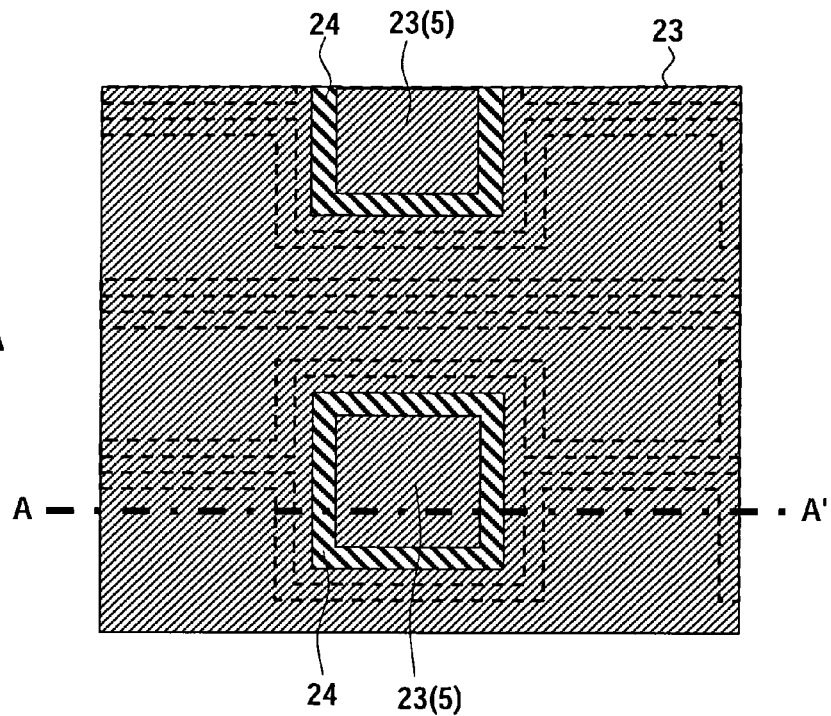
FIGS. 13A and 13B are plan views of the process in the method for producing the solid-state imaging device according to the present embodiment.
Figure 13B:
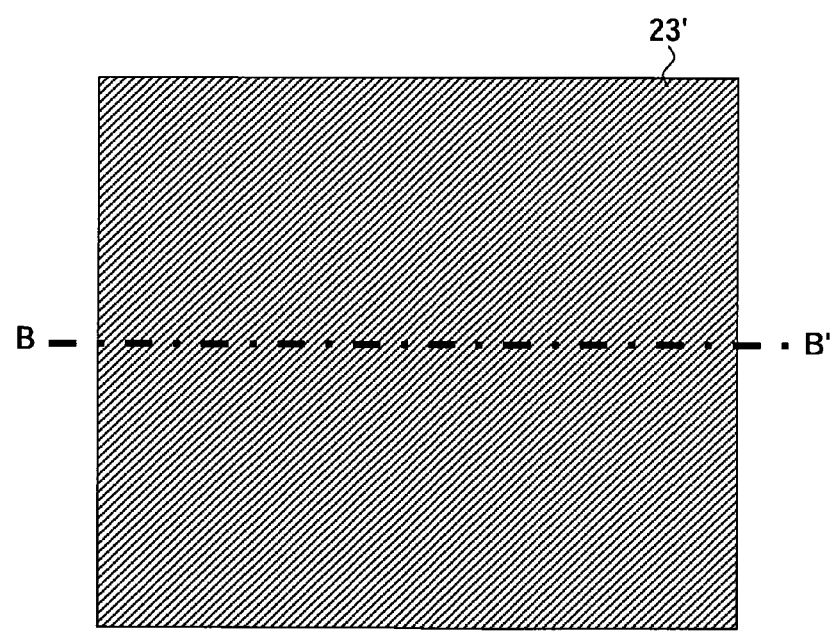

FIGS. 13A and 13B are plane views in the above case. FIG. 13A is a plan view of a main portion of the imaging region and FIG. 13B is a plane view of a main portion of the periphery portion. FIG. 12A corresponds to a cross-sectional view along A-A' line in FIG. 13A and FIG. 12B corresponds to a cross-sectional view along B-B' line in FIG. 13B.

The shield film 23 has a recess portion at a position covering the light receiving unit 5 and at a projection portion at a position covering the transfer electrodes 21. By performing the entire etch-back, the sidewall insulation film 24 is formed in a frame shape in the periphery portion of the light receiving unit 5. In this case, the corner rounding is not generated in the sidewall insulation film 24, at the corner portions of a light receiving unit 5 region to secure a rectangle shape.

Figure 14A:
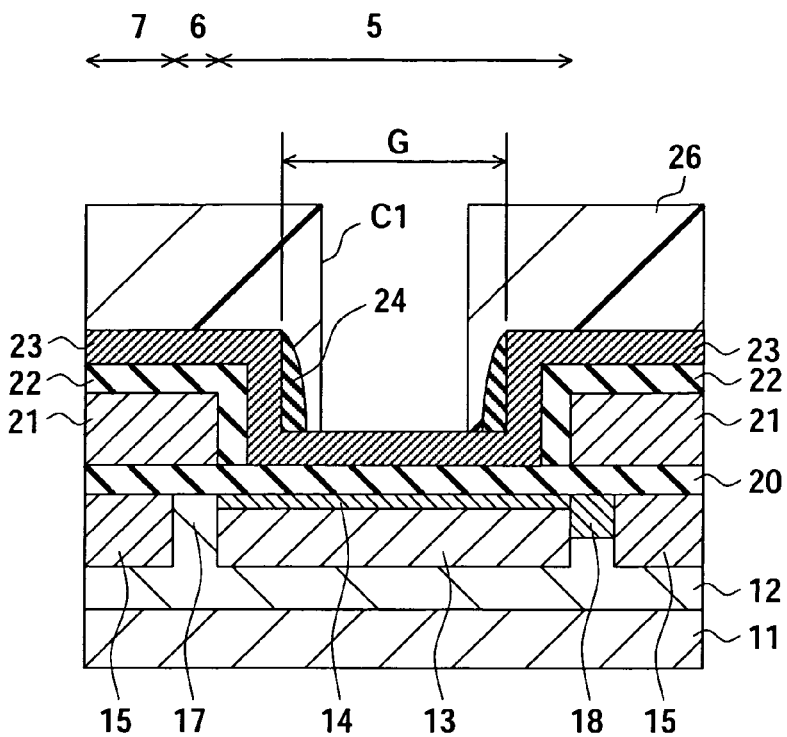
FIGS. 14A and 14B are cross-sectional views of the process in the method for producing the solid-state imaging device according to the present embodiment.
Figure 14B:
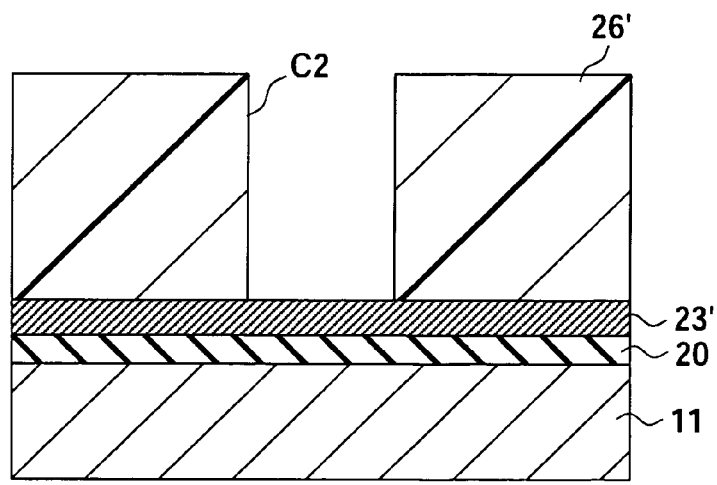

As shown in FIG. 14A, by coating a resist, and exposing and developing the same, the resist film (mask layer) 26 is formed with the mask aperture C1 at a position corresponding to the light receiving unit 5. At the same time, as shown in FIG. 14B, a monitor resist film 26' is formed with a monitor mask aperture C2 in the periphery portion. The dimensions of the mask aperture C1 and the monitor mask aperture C2 are preferably the same. The side wall of the shield film 23 is protected by the sidewall insulation film 24, so the dimension of the mask aperture C1 is possible to have a permissive range and the mask aperture C1 may be formed in an inner side of a region G surrounded by the side wall of the shield film 23. The resist film 26 mainly functions as a protective film for protecting a surface of the shield film 23. In the above case, a photoresist pattern may be formed by using a bottom anti-reflection coating (BARC).

Figure 15A:
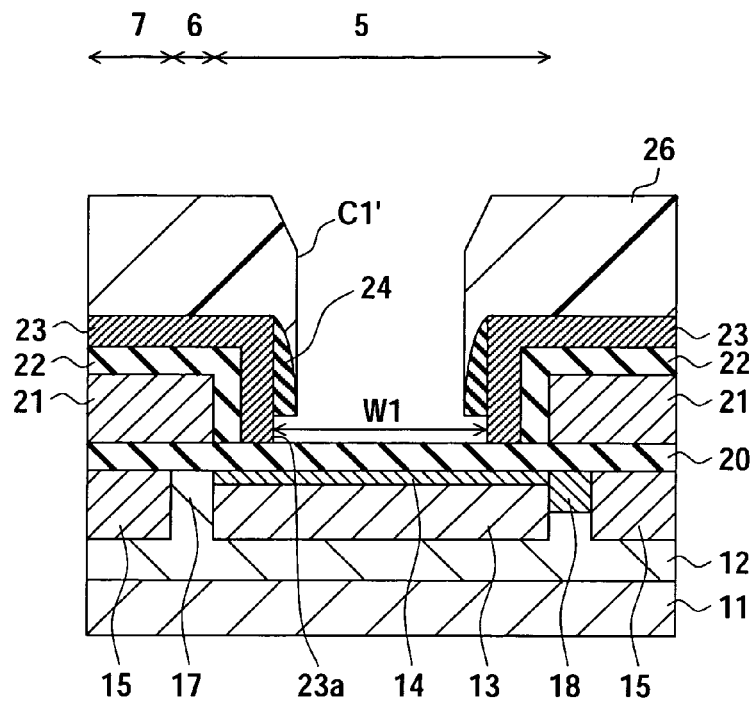
FIGS. 15A and 15B are cross-sectional views of the process in the method for producing the solid-state imaging device according to the present embodiment.
Figure 15B:
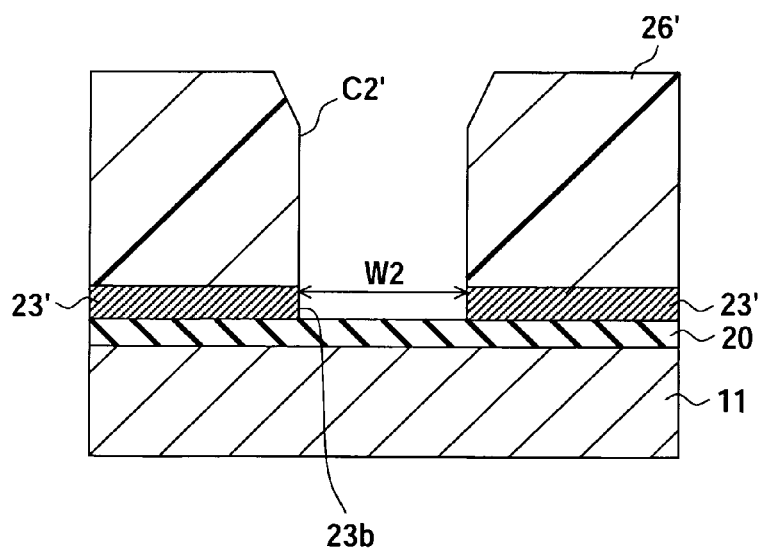

As shown in FIG. 15A, the shield film 23 is etched by using the resist film 26 and the sidewall insulation film 24 as a mask to form the aperture portion 23a in the shield film 23. In the etching process, an isotropic dry etching is applied to generate a side etching in the shield film 23 to thereby remove a shield film portion (extending portion) under the sidewall insulation film 24. As the etching is performed, the mask apertures C1 and C2 become mask apertures C1' and C2' having larger sizes than that of the mask apertures C1 and C2.

A line width W1 of the aperture portion 23a formed in the shield film 23 is hardly observed directly due to the sidewall insulation film 24. Therefore, the line width W1 of the aperture portion 23a can be managed by observing a line width W2 of the monitor aperture portion 23b formed in the monitor shield film 23' provided in the periphery portion. In order to manage the width, a relationship between the line widths of the aperture portion 23a and the monitor aperture portion 23b may be prepared in advance.

Figure 16A:
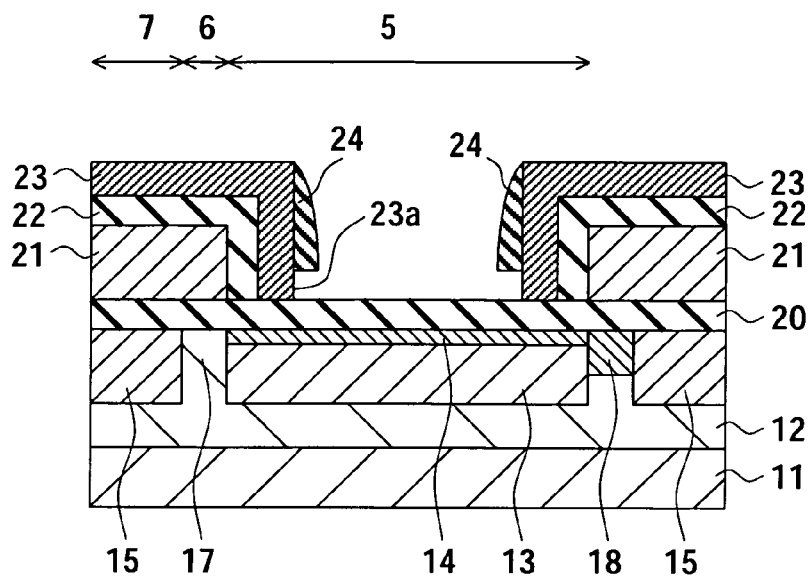
FIGS. 16A and 16B are cross-sectional views of the process in the method for producing the solid-state imaging device according to the present embodiment.
Figure 16B:
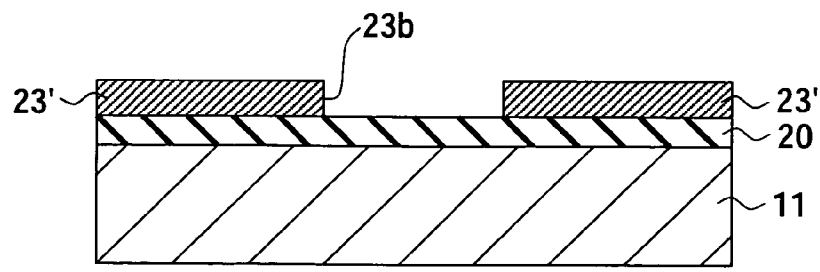
Figure 17A:
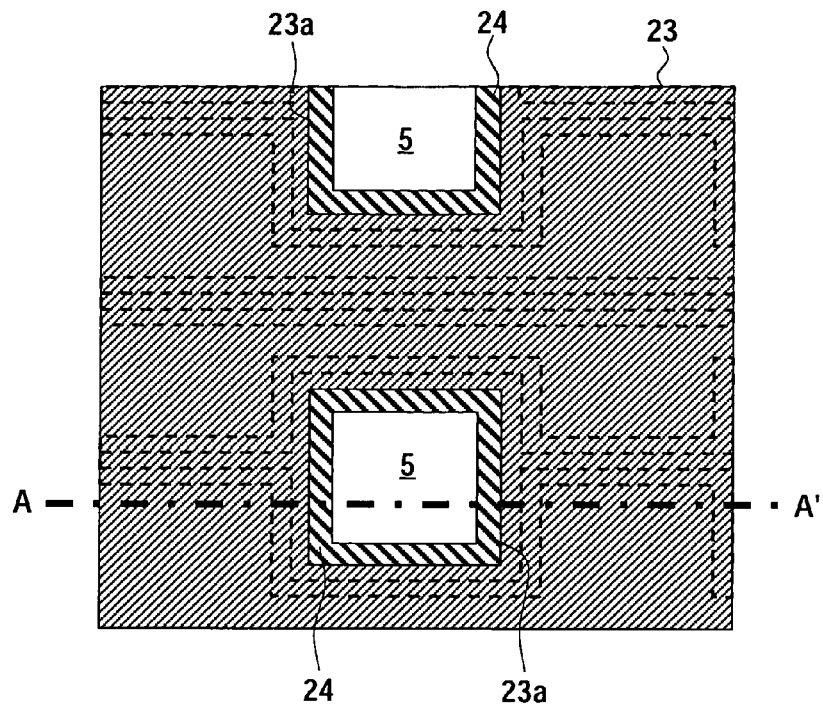
FIGS. 17A and 17B are plan views of the process in the method for producing the solid-state imaging device according to the present embodiment.
Figure 17B:
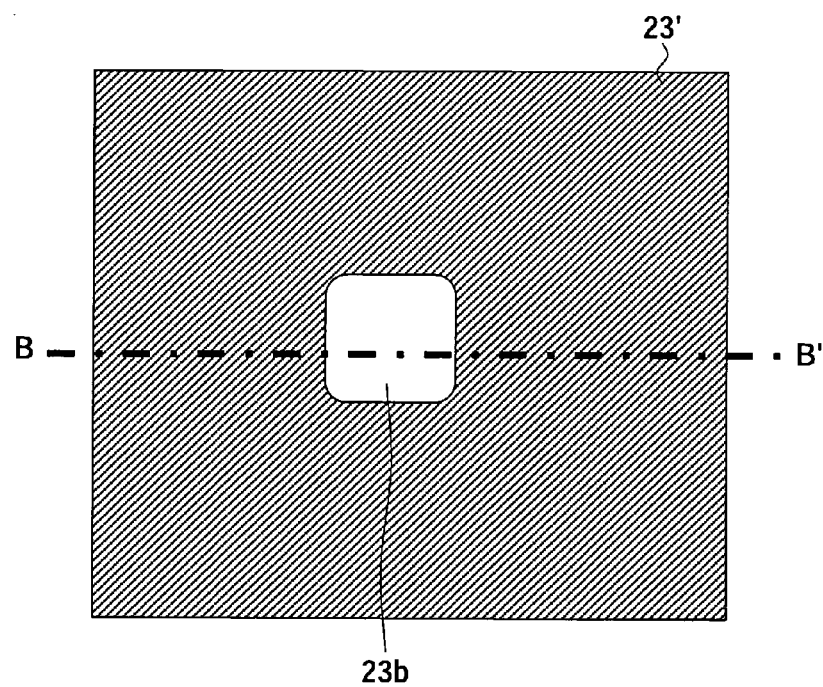

As shown in FIGS. 16A and 16B, the resist film 26 and the monitor resist film 26' are removed. FIGS. 17A and 17B are plan views in this case. FIG. 17A is a plan view of a main portion of the imaging region and FIG. 17B is a plan view of the periphery portion. FIG. 16A corresponds to a cross-sectional view along A-A' line in FIG. 17A and FIG. 16B corresponds to a cross-sectional view along B-B' line in FIG. 17B.

As shown in FIG. 17A, the aperture portion 23a of the shield film 23 is formed in the rectangle shape. The frame shaped sidewall insulation film 24 is remained along the rectangle shaped aperture portion 23a. The sidewall insulation film 24 is formed by an optically transparent film made of silicon oxide or silicon nitride, for example, so the light emitted to the sidewall insulation film 24 reaches the light receiving unit 5. Note that, as shown in FIG. 17B, the monitor aperture portion 23b is formed by etching used with the resist as the mask, so the corner rounding is generated therein.

Figure 18A:
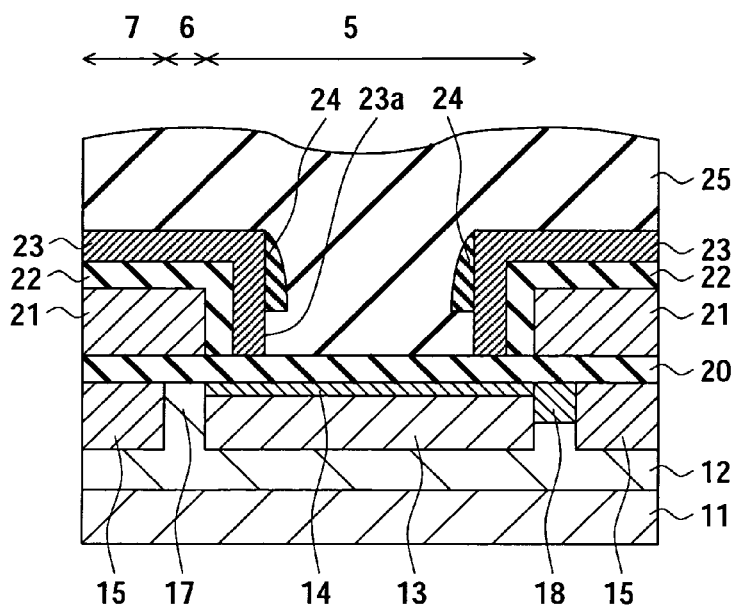
FIGS. 18A and 18B are cross-sectional views of the process in the method for producing the solid-state imaging device according to the present embodiment.
Figure 18B:
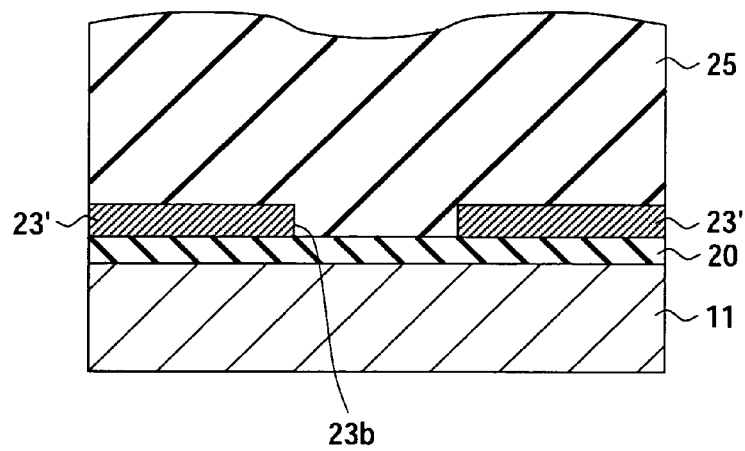

As shown in FIGS. 18A and 18B, the protective insulation film 25 is formed to cover the shield film 23 and the inside of the aperture portion 23a. As the protective insulation film 25, a high fluid BPSG film is deposited and carried out a reflow processing to fill the protective insulation film 25 under the sidewall insulation film 24.

As the following steps, if necessary, a color filter and an on-chip lens are formed to thereby produce the solid-state imaging device.

As described above, in the method for producing the solid-state imaging device according to the present embodiment, the insulation film 24a is etch-backed to form the sidewall insulation film 24 in self-alignment in the side wall of the shield film 23 covering the transfer electrodes 21, and the aperture portion 23a is formed by etching used with the sidewall insulation film 24 and the resist film 26 as a mask. Therefore, the aperture portion 23a of the shield film 23 dose not suffer from the variation in the dimension of the mask aperture C1 of the resist film 26, and is mainly processed by using the sidewall insulation film 24 formed in self-alignment. So the aperture portion 23a can be formed in a sufficient rectangle shape and without an extending portion. Note that, the resist film 26 functions as an etching protective film for protecting a surface of the shield film 23. As a result, the area of the aperture portion 23a can be enlarged and the light sensitivity characteristic can be improved.

The side wall of the shield film 23 surrounding the light receiving unit 5 is protected by the sidewall insulation film 24, so a sufficient margin can be prepared to the shift of the line width and the superposition in the lithography processing for forming the resist film 26. Namely, the side wall of the shield film 23 is not made thin caused by the shift of the lithography processing, so a generation of smear can be suppressed. In the same way, the side wall of the shield film 23 is secured uniformity, so the variation in the light sensitivity can be suppressed.

In the imaging region, a management of the line width and a management of an etching stabilization of the aperture portion 23a of the shield film 23 are hardly observed from the upper portion due to the sidewall insulation film 24 formed along the outer edge of the light receiving unit 5. However, the line width of the monitor aperture portion 23b of the monitor shield film 23' formed in the periphery portion is monitored, so the management of the line width and the management of the etching stabilization can be performed.

According to the solid-state imaging device of the present embodiment, the extending portion of the shield film 23 is not formed in the aperture portion 23a and the shield film 23 is formed in the sufficient rectangle shape, so the area of the aperture portion 23a of the shield film 23 can be enlarged to improve the light sensitivity characteristic. Although the sidewall insulation film 24 in the frame shape remains along the outer edge of the light receiving unit 5, since the sidewall insulation film 24 is made from the optically transparent insulation film, the light emitted to the sidewall insulation film 24 is received to the light receiving unit 5 and applied to a photoelectric conversion.

The above solid-state imaging device is applied to a camera such as a video camera, a digital steal camera, or an electric endoscope camera.

Figure 19:
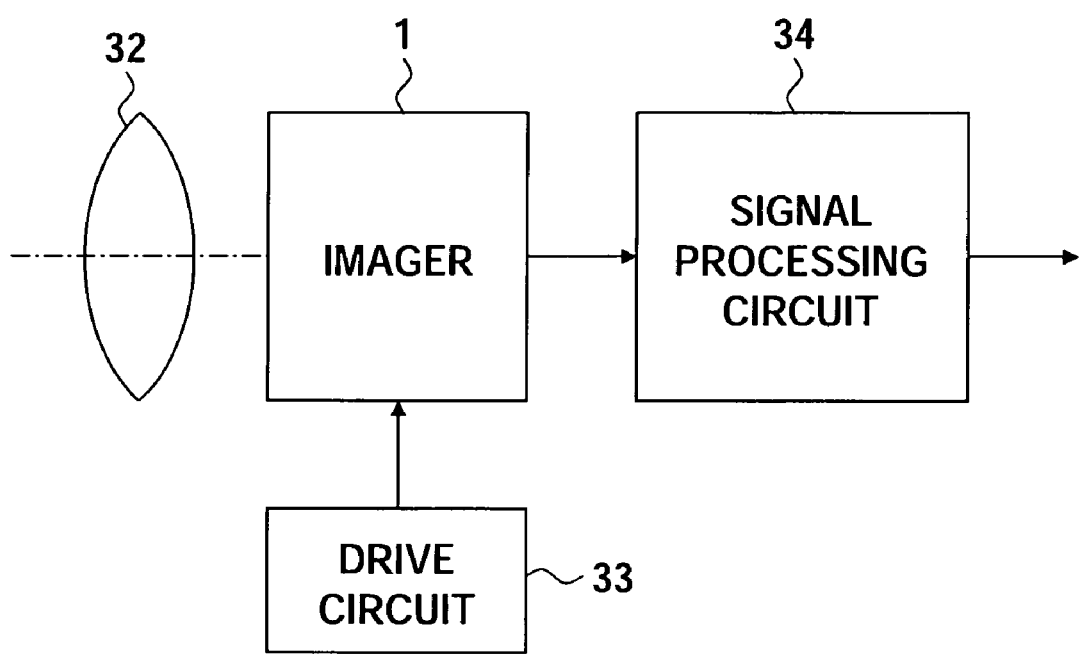
FIG. 19 is a block diagram illustrating a schematic configuration of a camera applied to the solid-state imaging device according to the present embodiment.

FIG. 19 is a block diagram of a camera applied with the above solid-state imaging device.

A camera 30 has a solid-state imaging device (for example, a charge coupled imaging device (CCD)) 1, an optical system 32, a drive circuit 33, and a signal processing circuit 34.

The optical system 32 focuses the imaging light from an object to be imaged (incidence light) on an imaging surface of the solid-state imaging device 1. Therefore, the imaging light is converted to the signal charges corresponding to the amount of the light in the respective light receiving units 5 of the solid-state imaging device 1 and the signal charges are stored for a predetermined period in the signal charge storage region 13 of the light receiving unit 5.

The drive circuit 33 applies various timing signals such as the four phases of the clock signals φV1, φV2, φV3, and φV4 and the two phases of the clock signals φH1 and φH2 to the solid-state imaging device 1. Therefore, various drive operations such as a read operation, a vertical transfer operation and a horizontal transfer operation of the signal charges in the solid-state imaging device 1 are performed. And, an analog image signal is output from the output unit 4 of the solid-state imaging device 1.

The signal processing circuit 34 performs various signal processing such as an elimination of noise from the analog image signal output from the solid-state imaging device 1 and a conversion of the analog image signal to a digital signal. The signal processing are performed by the signal processing circuit 34, and then the resultants are stored in a memory medium such as a memory.

In this way, the above solid-state imaging device 1 in which the light sensitivity characteristic is improved, is applied to the camera 30 such as the video camera and the digital steel camera, so the light sensitivity characteristic of the camera 30 can be improved.

The present invention is not limited to the above embodiments.

Although the present embodiment is applied to the interline transfer system solid-state imaging device as described above, it may be applied to a frame interline transfer system solid-state imaging device. It may be also applied to a back-illuminated solid-state imaging device receiving a light from a back surface of the substrate 11 and a CMOS type solid-state imaging device.

For example, in the case of the CMOS solid state imaging device, a shield film is formed on an interconnection layer. The interconnection layer is formed in a region except for a light receiving unit, so the shield film may be formed in a shape projected out around the light receiving unit. In the above case, a sidewall insulation film may be formed by applying the present invention in a side wall of the shield film around the light receiving unit, and a rectangle aperture portion may be formed in self-alignment by etching used with the sidewall insulation film as a mask.

A mask layer such as a hard mask made of inorganic material may be used in addition to the resist film 26. Note that, a pattern of the hard mask is formed by etching used with a resist film.

It should be understood by those skilled in the art that various modifications, combinations, sub-combinations and alterations may occur depending on design requirements and other factors in so far as they are within scope of the appeared claims or the equivalents thereof.

What is claimed is:

1. A method for producing a solid-state imaging device comprising the steps of:
   forming a light receiving unit in an imaging region of a substrate;
   forming a shield film projected out around the light receiving unit, on the substrate;
   forming an optically transparent insulation film on the shield film;
   processing the insulation film by etch-back to form a sidewall insulation film in a side wall of the shield film formed in a periphery portion of the light receiving unit;
   forming a mask layer having a mask aperture at a position corresponding to the light receiving unit, on the shield film; and
   etching the shield film by using the sidewall insulation film and the mask layer as an etching mask to form an aperture portion exposing the light receiving unit;
   wherein, in the step of forming the aperture portion, the shield film under the sidewall insulation film is removed.

2. The method of claim 1, further comprising a step of forming an electrode in a region of the substrate except for the light receiving unit between the step of forming the light receiving unit and the step of forming the shield film, wherein, in the step of forming the shield film, the shield film is formed to cover the light receiving unit and the electrode.

3. The method of claim 2, wherein the electrode is a transfer electrode.

4. The method of claim 2, wherein, in the step of forming the electrode, the electrode is formed by a single layer or a plurality of layers.

5. The method of claim 1, wherein, in the step of forming the aperture portion, the aperture portion is formed in a rectangle shape.

6. The method of claim 1, wherein, in the step of forming the aperture portion, the shield film is processed by isotropic etching used with the sidewall insulation film and the mask layer as an etching mask.

7. A method for producing a solid-state imaging device comprising the steps of:
  forming a light receiving unit in an imaging region of a substrate;
  forming a shield film projected out around the light receiving unit, on the substrate;
  forming an optically transparent insulation film on the shield film;
  processing the insulation film by etch-back to form a sidewall insulation film in a side wall of the shield film formed in a periphery portion of the light receiving unit;
  forming a mask layer having a mask aperture at a position corresponding to the light receiving unit, on the shield film; and
  etching the shield film by using the sidewall insulation film and the mask layer as an etching mask to form an aperture portion exposing the light receiving unit,
  wherein,
  in the step of forming the shield film, a monitor shield film is formed on the substrate in a periphery portion of the imaging region;
  in the step of forming the mask layer, a monitor mask layer with a mask aperture is formed on the monitor shield film; and
  in the step of etching the shield film, a width of the aperture portion exposing the light receiving unit is managed by monitoring a width of the aperture portion formed in the monitor shield film.

8. A solid-state imaging device comprising:
  a light receiving unit formed in a substrate;
  a shield film formed on the substrate and having an aperture portion at a position corresponding to the light receiving unit; and
  an optically transparent sidewall insulation film formed in an upper portion of a side wall of the shield film along an edge of the aperture portion, the shield film under the sidewall insulation film being removed.

9. The solid-state imaging device as set forth in claim 8, further comprising an electrode formed in a region except for the light receiving unit on the substrate, wherein the shield film is formed to cover the electrode.

10. The solid-state imaging device as set forth in claim 9, wherein the electrode is a transfer electrode.

11. The solid-state imaging device as set forth in claim 9, the electrode is formed by a single layer or a plurality of layers.

12. The solid-state imaging device as set forth in claim 8, further comprising an interlayer insulation film covering the shield film, wherein a region under the sidewall insulation film is filled by the interlayer insulation film.

13. The solid-state imaging device as set forth in claim 8, wherein the aperture portion of the shield film is a rectangle shape.

14. A camera comprising:
  a solid-state imaging device;
  an optical system focusing light on a imaging surface of the solid-state imaging device;
  and a signal processing circuit performing a predetermined signal processing to a signal output from the solid-state imaging device,
  wherein the solid-state imaging device has a light receiving unit formed in a substrate, a shield film formed on the substrate and having an aperture portion at a position corresponding to the light receiving unit, and
  an optically transparent sidewall insulation film formed in an upper portion of a side wall of the shield film along an edge of the aperture portion, the shield film under the sidewall insulation film being removed.

15. The camera as set forth in claim 14, further comprising an electrode formed in the region except for the light receiving unit, wherein the shield film is formed to cover the electrode.

16. The camera as set forth in claim 15, wherein the electrode is a transfer electrode.

17. The camera as set forth in claim 15, wherein the electrode is formed by a single layer or a plurality of layers.

18. The camera as set forth in claim 14, further comprising an interlayer insulation film covering the shield film, wherein a region under the sidewall insulation film is filled by the interlayer insulation film.

19. The camera as set forth in claim 14, wherein the aperture portion of the shield film is a rectangle shape.

* * * * *